United States Patent
Chehadi

(12) 
(10) Patent No.: US 6,249,456 B1
(45) Date of Patent: Jun. 19, 2001

(54) SECURED EEPROM MEMORY COMPRISING MEANS FOR THE DETECTION OF ERASURE BY ULTRAVIOLET RADIATION

(75) Inventor: Mohamad Chehadi, Aix-en-Provence (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/448,632

(22) Filed: Nov. 24, 1999

(30) Foreign Application Priority Data

Dec. 2, 1998 (FR) .................................................. 98 15447

(51) Int. Cl.$^7$ .................................................. G11C 16/06
(52) U.S. Cl. .................. 365/185.2; 365/185.04; 365/185.32; 365/189.01
(58) Field of Search ............................ 365/185.2, 185.04, 365/185.05, 185.22, 185.29, 185.32, 189.01

(56) References Cited

U.S. PATENT DOCUMENTS 4,947,378 * 8/1990 Jinbo et al. ........................... 365/222
5,198,997 * 3/1993 Arakawa ............................... 365/185

FOREIGN PATENT DOCUMENTS

| 0 300 885 A1 | 1/1989 | (EP) | ............................... | G11C/17/00 |
| 0 417 008 A1 | 3/1991 | (EP) | ............................... | G11C/16/06 |
| 0 874 369 A2 | 10/1998 | (EP) | ............................... | G11C/16/00 |
| 2 567 302 | 7/1984 | (FR) | ............................... | G11C/11/40 |
| 83/00254 | 1/1983 | (WO) | ............................... | G11C/11/40 |

* cited by examiner

*Primary Examiner*—David Nelms
*Assistant Examiner*—David Lam
(74) *Attorney, Agent, or Firm*—Theodore E. Galanthay; Allen, Dyer, Doppelt Milbrath & Gilchrist, P.A.

(57) ABSTRACT

A secured electrically modifiable non-volatile memory includes a circuit to determine if memory cells therein have been exposed to ultraviolet radiation. The memory includes at least one additional memory cell, called a reference cell, and an associated read circuit for detecting any erasure of the reference cell by ultraviolet radiation. At each access to the memory, the reference cell is read by the associated read circuit. If the state of the reference cell is different from its initial electrical state, then operation of the memory is stopped.

24 Claims, 1 Drawing Sheet

US 6,249,456 B1

SECURED EEPROM MEMORY COMPRISING MEANS FOR THE DETECTION OF ERASURE BY ULTRAVIOLET RADIATION

FIELD OF THE INVENTION

The present invention relates to semiconductor memories, and, more particularly, to a secured electrically modifiable non-volatile memory.

BACKGROUND OF THE INVENTION

The expression "secured EEPROM memory" is understood to mean any memory to which write access is restricted to protect its contents. The protection may be either a software protection or a hardware protection. This type of EEPROM is protected especially against the electrical erasure of its cells.

One technique that has been devised by certain fraudulent individuals to circumvent protection against electrical erasure includes erasure by ultraviolet (UV) radiation although these memories, in theory, are protected by their packages against such erasure. These fraudulent individuals open the package of the memory to access its memory array and modify the state of the cells therein by exposing them to ultraviolet radiation. This fraudulent erasure does not necessarily stop the performance of the application in which the memory is used, and the fraud is therefore not necessarily detected.

SUMMARY OF THE INVENTION

An object of the invention is to provide a secured EEPROM type memory enabling the detection of the above described fraud, and making it possible to know if the cells of the memory have been subjected to ultraviolet radiation.

A secured electrically modifiable non-volatile memory comprises a matrix of memory cells and means for reading and writing in the memory cells. The memory further comprises at least one additional memory cell, called a reference cell, and associated read means capable of detecting any erasure of the reference cell by ultraviolet radiation. At each access to the memory, the reference cell is read by the associated read means.

The secured EEPROM type memory of the invention has only one reference cell. According to a first embodiment of the invention, the reference cell is initially in an erased electrical state. To detect any erasure of the reference cell by an ultraviolet radiation, the associated reading means has a detection threshold whose value ranges from the threshold value of conduction of an electrically erased cell to the threshold value of conduction of a cell erased by an ultraviolet radiation.

According to a second embodiment of the invention, the reference cell is initially in a programmed electrical state. To detect any erasure of the reference cell by an ultraviolet radiation, the associated read means have a detection threshold whose value ranges from the conduction threshold value of an electrically programmed cell to the conduction threshold value of a cell erased by ultraviolet radiation.

If the state of the reference cell detected by the associated read means is different from its initial electrical state, this indicates that the memory has been subjected to ultraviolet radiation, and the operation of the memory is then neutralized or stopped.

BRIEF DESCRIPTION OF THE DRAWINGS

Other features and advantages of the invention shall appear from the following detailed description made with reference to the appended drawings in which.

DETAILED DESCRIPTION OF THE PREFERRED EMBODIMENTS

Figure 1:
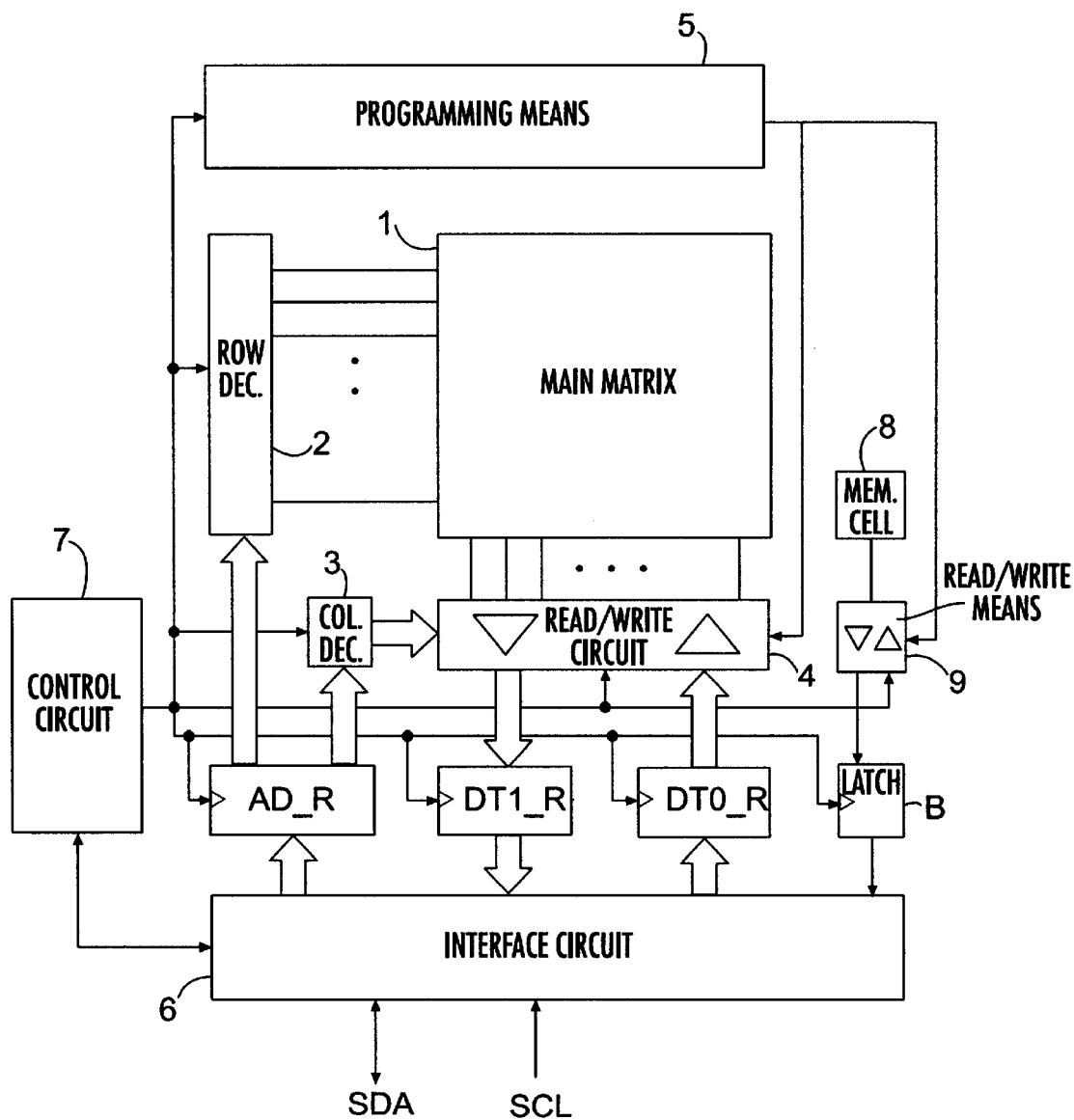
FIG. 1 shows an exemplary embodiment of an EEPROM type memory according to the present invention.

The secured EEPROM type memory shown in FIG. 1 comprises a main matrix 1 of memory cells addressable by a row decoder 2 and a column decoder 3. The column decoder 3 is associated with read and write circuits 4 for reading and writing in the main matrix cells. Programming means 5 provide the voltages needed for writing in the cells of the memory. The row decoders 2 and column decoders 3 are connected to an address register AD_R. The read and write circuits are connected to an input data register DTI_R and a data output register DTO_R. These three registers communicate with an interface circuit 6.

In the example shown in FIG. 1, the interface circuit 6 of the memory is connected to an $I^2C$ bus comprising a clock line SCL and a two-way line SDA to convey the addresses, data and commands. The assembly is controlled by a control circuit 7. The control circuit 7 is a programmable logic array (PLA) and is designed to provide control signals to all the elements of the memory as a function of the commands received by the interface circuit 6. In this example, the memory is secured by a software protection implemented in the control circuit 7.

Figure 2:
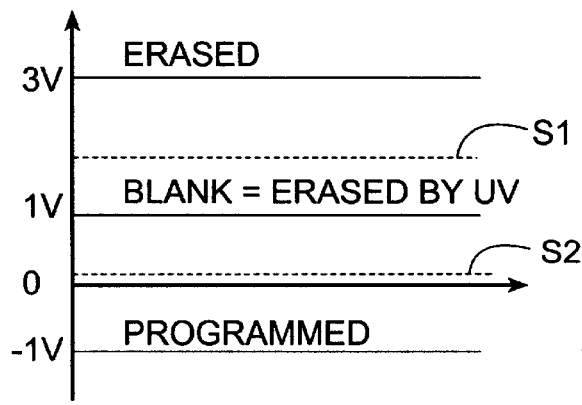
FIG. 2 shows the possible conduction thresholds of the memory cells and the detection threshold of the means for the reading of the reference cell according to the present invention.

The cell of the matrix 1 may take three possible electrical states as illustrated in FIG. 2. A first state is an erased state in which the value of the conduction threshold of the cells is about 3 volts, Second, a programmed state in which the value of the conduction threshold of the cells is about −1 volts. A third state is a blank state in which the value of the conduction threshold of the cells is about 1 volt. This is also the state in which there is a memory cell that has been erased by an ultraviolet radiation.

For the implementation of the invention, the diagram of the memory is complemented by an additional memory cell 8 called the reference cell. Read and write means 9 are connected to the reference cell. The means 9 are controlled by the control circuit 7. The read and write means 9 have a read or sense amplifier that compares the threshold value of conduction of the reference cell with that of a reference detection threshold. The sense amplifier delivers a logic value 0 if the value of the conduction threshold of the cell read is greater than the value of the reference threshold. Otherwise, it delivers a logic value 1.

The memory furthermore comprises an output latch circuit B having its input connected to the read and write means 9, and its output connected to the interface circuit 6. The reference cell 8 may be placed at the periphery of the main matrix 1 or, preferably, at the core of the matrix to make it more difficult to localize. This reference cell is initially in a programmed or erased state. This programming or erasure operation is performed in the factory by the manufacturer of the memory, or by the client when an application that uses this memory is being made. The reference cell is then protected against any read access by the control circuit 7, like the other cells of the matrix 1.

Advantageously, it is also possible to plan for several reference cells distributed throughout the main matrix 1 to detect any exposure, even a partial exposure, of the memory array to ultraviolet radiation. According to the invention, the state of the reference cell read by the read means 9 must enable the detection of any erasure of the memory by ultraviolet radiation since the previous access to the memory.

Thus, if the reference cell 8 is in an erased initial state, it is provided, according to the invention, that the detection threshold of the sense amplifier of the means 9 will have a value ranging between the threshold value of conduction of an electrically erased cell and a threshold value of conduction of a cell erased by ultraviolet radiation. This detection threshold is referenced S1 in the diagram of FIG. 2. The result thereof is that if the cells of the memory have not been subjected to ultraviolet radiation, the reference cell has remained in its initial erased state and the means 9 deliver a logic value 0 during the reading of the reference cell. If the cells of the memory have been erased by ultraviolet radiation, the reference cell is in a blank state and the means 9 deliver a logic value 1 during a reading of this cell.

Should the reference cell be initially in a programmed state, it is provided according to the invention that the detection threshold of the sense amplifier of the means 9 will have a value ranging from the threshold value of conduction of an electrically programmed cell to the threshold value of conduction of a cell erased by ultraviolet radiation. This detection threshold is referenced S2 in the diagram of FIG. 2. Thus, if the cells of the memory have been subjected to ultraviolet radiation, the reference cell is in a blank state and the means 9 deliver a logic value 0. If not, they deliver a logic value 1.

The reference cell 8 is read at each memory access. The value read is then stored in an output latch circuit B whose input is connected to the output of the read means 9, and whose output is connected to the interface circuit 6. The storage of the value read by the means 9 in the latch circuit B is activated by the control circuit 7.

The value stored in the output latch circuit B is then processed by the control circuit 7 of the memory. It is compared, for example, with the reference logic value 0 or 1 corresponding to the initial value stored by the manufacturer in the reference cell 8. A logic value 0 corresponds to an erased cell and a logic value 1 corresponds to a programmed cell. If these values are different, then it means that there has been an exposure of the memory cells to ultraviolet radiation and the operation of the control circuit 7 is then stopped.

As a variation, the value stored in the latch circuit B may be processed by means of circuits external to the memory. This value is transmitted to them by means of the interface circuit 6. These external circuits are, for example, the circuits needed to implement an application. This value is then compared with the initial value of the reference cell. If the two values are different, then the running of the application is stopped.

That which is claimed is:

1. A secured electrically modifiable non-volatile memory comprising:
    a matrix of memory cells;
    means for reading and writing in said matrix of memory cells;
    at least one reference memory cell; and
    reading means for detecting an erasure of said reference memory cell by ultraviolet radiation and for reading said at least one reference memory cell upon access to said matrix of memory cells.

2. A secured electrically modifiable non-volatile memory according to claim 1, wherein reading said at least one reference memory cell upon access to said matrix of memory cells is performed at each access to said matrix of memory cells.

3. A secured electrically modifiable non-volatile memory according to claim 1, wherein said at least one reference memory cell comprises only one reference memory cell.

4. A secured electrically modifiable non-volatile memory according to claim 1, wherein said at least one reference memory cell is initially in an erased electrical state; and said reading means has a detection threshold whose value ranges from a threshold value of conduction of an electrically erased memory cell to a threshold value of conduction of a memory cell erased by an ultraviolet radiation for detecting any erasure of said at least one reference memory cell by an ultraviolet radiation.

5. A secured electrically modifiable non-volatile memory according to claim 1, wherein said at least one reference memory cell is initially in a programmed electrical state; and wherein said reading means has a detection threshold whose value ranges from a conduction threshold value of an electrically programmed memory cell to a conduction threshold value of a memory cell erased by ultraviolet radiation for detecting erasure of said at least one reference memory cell by an ultraviolet radiation.

6. A secured electrically modifiable non-volatile memory according to claim 1, further comprising an output latch circuit for storing an electrical state of said at least one reference memory cell when read by said reading means.

7. A secured electrically modifiable non-volatile memory according to claim 5, wherein if the electrical state of said at least one reference memory cell stored in said output latch circuit is different from its initial electrical state, then operation of the memory is stopped.

8. A non-volatile memory comprising:
    a matrix of memory cells;
    a read/write circuit connected to said matrix of memory cells;
    at least one reference memory cell;
    a read circuit connected to said at least one reference memory cell for detecting an erasure of said at least one reference memory cell by ultraviolet radiation and for reading said at least one reference cell upon access to said matrix of memory cells; and
    an output latch circuit connected to said read circuit for storing an electrical state of said at least one reference memory cell when read by said read circuit;
    if the electrical state of said at least one reference memory cell stored in said output latch circuit is different from its initial electrical state, then operation of the memory is stopped.

9. A non-volatile memory according to claim 8, wherein said non-volatile memory comprises a EEPROM.

10. A non-volatile memory according to claim 8, wherein said at least one reference memory cell comprises only one reference memory cell.

11. A secured electrically modifiable non-volatile memory according to claim 8, herein reading said reference memory cell upon access to said matrix of memory cells is performed at each access to said matrix of memory cells.

12. A non-volatile memory according to claim 8, wherein said at least one reference memory cell is initially in an erased electrical state; and said read circuit has a detection threshold whose value ranges from a threshold value of conduction of an electrically erased memory cell to a threshold value of conduction of a memory cell erased by an ultraviolet radiation for detecting any erasure of said at least one reference memory cell by an ultraviolet radiation.

13. A non-volatile memory according to claim 8, wherein said at least one reference memory cell is initially in a programmed electrical state; and wherein said read circuit has a detection threshold whose value ranges from a conduction threshold value of an electrically programmed memory cell to a conduction threshold value of a memory cell erased by ultraviolet radiation for detecting erasure of said at least one reference memory cell by an ultraviolet radiation.

14. A non-volatile memory comprising:
   a matrix of memory cells;
   at least one reference memory cell; and
   at least one read circuit connected to said matrix of memory cells and to said at least one reference memory cell for detecting an erasure of said at least one reference memory cell by ultraviolet radiation and for reading said at least one reference cell.

15. A non-volatile memory according to claim 14, wherein said at least one read circuit connected for reading said at least one reference cell is performed upon access to said matrix of memory cells.

16. A non-volatile memory according to claim 14, further comprising an output latch circuit connected to said read circuit for storing an electrical state of said at least one reference memory cell when read by said read circuit; and if the electrical state of said at least one reference memory cell stored in said output latch circuit is different from its initial electrical state, then operation of the memory is stopped.

17. A non-volatile memory according to claim 14, wherein said at least one reference memory cell is initially in an erased electrical state; and said read circuit has a detection threshold whose value ranges from a threshold value of conduction of an electrically erased memory cell to a threshold value of conduction of a memory cell erased by an ultraviolet radiation for detecting any erasure of said at least one reference memory cell by an ultraviolet radiation.

18. A non-volatile memory according to claim 14, wherein said at least one reference memory cell is initially in a programmed electrical state; and wherein said read circuit has a detection threshold whose value ranges from a conduction threshold value of an electrically programmed memory cell to a conduction threshold value of a memory cell erased by ultraviolet radiation for detecting erasure of said at least one reference memory cell by an ultraviolet radiation.

19. A method for detecting erasure by ultraviolet radiation of a non-volatile memory comprising a matrix of memory cells and at least one reference memory cell, the method comprising the steps of:
   reading the at least one reference memory cell;
   storing an electrical state of the at least one reference memory cell after reading the reference memory cell; and
   comparing the stored electrical state of the at least one reference memory cell with its initial electrical state for detecting an erasure of the reference memory cell by ultraviolet radiation.

20. A method according to claim 19, wherein reading the at least one reference memory cell is performed upon access to the matrix of memory cells.

21. A method according to claim 19, further comprising stopping operation of the memory if the stored electrical state of the at least one reference memory cell is different than its initial electrical state.

22. A method according to claim 19, wherein the at least one reference memory cell comprises only one reference memory cell.

23. A method according to claim 19, wherein the at least one reference memory cell is initially in an erased electrical state; and wherein the step of comparing includes using a detection threshold whose value ranges from the threshold value of conduction of an electrically erased memory cell to the threshold value of conduction of a memory cell erased by an ultraviolet radiation for detecting any erasure of the at least one reference memory cell by an ultraviolet radiation.

24. A method according to claim 19, wherein the at least one reference memory cell is initially in a programmed electrical state; and wherein the step of comparing uses a detection threshold whose value ranges from a conduction threshold value of an electrically programmed memory cell to a conduction threshold value of a memory cell erased by ultraviolet radiation for detecting erasure of the at least one reference memory cell by an ultraviolet radiation.

\* \* \* \* \*